US012672360B2

(12) United States Patent
Cornagliotti et al.

(10) Patent No.: US 12,672,360 B2
(45) Date of Patent: Jun. 30, 2026

(54) SOLAR MODULE WITH IMPROVED BONDING

(71) Applicant: Lightyear Layer IPCo B.V., Helmond (NL)

(72) Inventors: Emanuele Cornagliotti, Uccle (BE); Simone Regondi, Eindhoven (NL); Dario Di Carlo Rasi, Helmond (NL)

(73) Assignee: Lightyear Layer IPCo B.V., Helmond (NL)

( * ) Notice: Subject to any disclaimer, the term of this patent is extended or adjusted under 35 U.S.C. 154(b) by 5 days.

(21) Appl. No.: 18/569,896

(22) PCT Filed: Jun. 24, 2022

(86) PCT No.: PCT/EP2022/067350
§ 371 (c)(1),
(2) Date: Dec. 13, 2023

(87) PCT Pub. No.: WO2022/269036
PCT Pub. Date: Dec. 29, 2022

(65) Prior Publication Data
US 2024/0290899 A1 Aug. 29, 2024

(30) Foreign Application Priority Data
Jun. 25, 2021 (NL) .................................... 2028545

(51) Int. Cl.
*H10F 19/80* (2025.01)
*H10F 19/85* (2025.01)
*H10F 19/90* (2025.01)
(52) U.S. Cl.
CPC ........... *H10F 19/80* (2025.01); *H10F 19/807* (2025.01); *H10F 19/85* (2025.01); *H10F 19/908* (2025.01)

(58) Field of Classification Search
CPC ................... H10F 19/80–85; H10F 19/90–908
See application file for complete search history.

(56) References Cited

U.S. PATENT DOCUMENTS

2008/0236655 A1    10/2008    Baldwin et al.
2009/0260675 A1    10/2009    Erdemli et al.
(Continued)

FOREIGN PATENT DOCUMENTS

DE        102010027747 A1    10/2011
WO           2014077686 A1    5/2014
WO        WO-2020064474 A1 *  4/2020    ........... H01L 31/048

OTHER PUBLICATIONS

Netherlands Search Report and Written Opinion dated Aug. 14, 2021, for Netherlands Patent Application No. 2028545.
(Continued)

*Primary Examiner* — Lindsey A Buck
(74) *Attorney, Agent, or Firm* — Patterson + Sheridan, LLP

(57) ABSTRACT

The invention relates to a solar module with improved bonding. The solar module (100) comprises a front encapsulant layer (104), solar cells (106), a middle encapsulant layer (108), a back contact foil (210b) with a patterned copper pattern (210b) thereon, and a back encapsulant layer (112). Inventors found that, when producing such a solar module, the bonding between the middle encapsulant layer and the copper side of the back contact foil was insufficient. A solution is found in providing cut-outs in the back contact foil through which the back encapsulant layer can bond to the middle encapsulant layer and/or the solar cells.

9 Claims, 2 Drawing Sheets

(56)           References Cited

U.S. PATENT DOCUMENTS

| | | | | |
|---|---|---|---|---|
| 2014/0102508 | A1* | 4/2014 | Ishii ..................... | H10F 77/937 |
| | | | | 136/244 |
| 2017/0133537 | A1* | 5/2017 | Liu ........................ | H10F 19/85 |
| 2019/0305152 | A1* | 10/2019 | Masuko ............... | H10F 19/908 |
| 2021/0351316 | A1* | 11/2021 | Regondi .............. | H10F 71/137 |

OTHER PUBLICATIONS

PCT International Search Report and Written Opinion dated Oct. 10, 2022, for International Application No. PCT/EP2022/067350.

* cited by examiner

SOLAR MODULE WITH IMPROVED BONDING

TECHNICAL FIELD OF THE INVENTION

The invention relates to a solar module comprising:
A multitude of solar cells, each cell having a photosensitive frontside and having a backside, the backside equipped with electrodes,
A front encapsulant layer bonded to the frontside of the solar cells,
A middle encapsulant layer with cut-outs, the cut-outs aligned with the electrodes of the solar cells, the middle encapsulant layer bonded to the backside of the solar cells,
A back contact foil with a patterned metallization layer, the patterned metallization layer facing the solar cells, the patterned metallization layer for contacting the electrodes of the solar cells, the side with the patterned metallization layer bonded to the middle encapsulant layer,
A conductive paste or solder electrically connecting the electrodes to parts of the patterned metallization layer,
A back encapsulant layer bonded to the back contact foil in such a manner that the back contact foil is sandwiched between the middle encapsulant layer and the back encapsulant layer,

BACKGROUND OF THE INVENTION

Solar cells are thin wafers having a photosensitive side and an opposite side. Solar cells deliver typically 0.5 to 0.7 V at their maximum power point (when irradiated with sunlight) and are serialized, thereby forming a string with a voltage of typically between 12 V and 50 V (so: safe voltages), although strings with a voltage below 12V or above 50V are known to be used.

Prior art solar assemblies often use solar cells with anodes at one side and cathode at the opposite side. The solar cells are serialized using so-called "finger electrodes" or "tab wires", interconnecting the anode or anodes of one solar cell with the cathode or cathodes of a neighboring solar cell. Both the wires and the electrodes on the photosensitive side of the solar cells reduce the surface that is used to capture solar light, and for the wires to cross from the photosensitive side of one solar cell to the opposite side of the neighboring cell the cells must be spaced, further reducing the total photosensitive area of the module.

Some solar assemblies therefore often use so-called back-contacted solar cells, having anodes and cathodes at one side, the side opposite to the photosensitive side. They can be serialized using a back contact foil that is a plastic film (for example PET) with a conductive pattern attached to it using an adhesive, the back contact foil thus resembling a flexible printed circuit board. The electrodes of the solar cells (anodes, cathodes) are electrically connected to the back contact foil using conductive glue or solder.

The solar cells are laminated between two layers of encapsulant, in which one, the front encapsulant forming the front encapsulant layer, is bonded to the frontside (the photosensitive side) of the solar cells, and the middle encapsulant layer forming the middle encapsulant layer, bonds the back contact foil to the backside of the solar cells. The middle I encapsulant layer is equipped with cut-outs, enabling the electrical contact between the back contact foil and the solar cells. The cut-outs are aligned to the electrodes on the backside of the solar cells and the conductive glue is applied in the cut-outs, thereby electrically connecting the electrodes on the solar cells with the back contact foil.

International patent application publication WO2014077686 describes a stack of (at least one) back-contacted solar cell, an encapsulant layer and a back contact film (or back contact sheet). The encapsulant-comparable of the before mentioned middle encapsulant layer-bonds the solar cells to the back contact film. The back contact film is provided with a patterned conductive layer showing contacting areas located at locations corresponding to the position of the electrodes of the solar cells. The encapsulant has a pattern of holes, or cut-outs, at these locations so that electrical contact is made between the electrodes and the pattern by dots of conductive glue. The international patent application publication further also describes an additional encapsulant layer between the photosensitive side of the solar cells and a glass plate covering the solar module.

To further improve the strength (rigidity) of the stack a further encapsulant layer, the back encapsulant layer, is added to bond the stack to re-enforcement layer, the re-enforcement layer comprising for example a rear glass or a fiber.

When using a solar module. for e.g. a vehicle, such as the Lightyear One, commercially available from Atlas Technologies B.V., Helmond, the Netherlands, an module. without (metal) bezel is preferred. The glass surface to which the solar module. is bonded must, among others, make the glass as unbreakable (shatter proof) as possible. This not only to keep the module. attached to the glass, but also to keep the glass surface itself intact and thus safe. This implies that all layers must be bonded as strong as possible to each other.

The skilled person will recognize that the encapsulant between glass and solar cells must be transparent (to pass sunlight to the solar cells), but that other encapsulant layers need not be transparent. For esthetical reasons the encapsulant between solar cells and back side foil is black, so that the edges between the (dark) solar cells are not or hardly visible.

Inventors found that the bonding between all layers is high, except for the bonding of the middle encapsulant to the copper of the back contact foil, and the bonding of the copper to the polymer of the back contact foil.

The weak bonding of these layers (encapsulant to copper and copper to polymer) presents a problem in that it can lead to delamination of the module.

The invention intends to provide a solution to this problem.

SUMMARY OF THE INVENTION

To that end the invention is characterized in that the back contact foil shows cut-outs through which the back encapsulant layer bonds to the middle encapsulant layer and/or to the solar cells.

By making openings in the back contact foil through which the back encapsulant layer contacts the middle encapsulant layer, bonding is improved. The same holds if the both the back contact foil and the middle encapsulant show aligned cut-outs, and the back encapsulant layer is in direct contact with parts of the solar cells.

It is noted that the person skilled in the art may think that by locally removing copper from the back contact foil, thereby baring parts of the polymer, and bonding the middle encapsulant to those bared areas, the problem is already solved. However, experiments showed that the bonding between middle encapsulant and polymer is only slightly better than the bonding between middle encapsulant and copper. A possible reason might be that the adhesive used to bond the copper to the polymer is not completely removed and inhibits a strong bond.

It is further noted that each opening or cut-out in the back contact foil may correspond to one solar cell, but may also cover several cells, for example an area where four cells border each other.

In another embodiment the solar module further comprising a re-enforcement layer bonded to the back encapsulant layer.

To further improve the strength or rigidity of the module the back encapsulant layer is bonded to a re-enforcement layer. The re-enforcement layer preferably has a thermal expansion coefficient close to that of the transparent surface. This is best achieved when the re-enforcement layer and the transparent surface comprise similar materials, for example glass fibres (if the transparent surface comprises or consists of glass) or comprises a plastic like polycarbonate (if the transparent surface comprises or consists of a plastic like polycarbonate).

It is noted that the re-enforcement layer may be a glassy material (amorphous) or a composite material, for example a laminate comprising several plies of glass fibre and embedded in a resin, a sandwich structure, glass or polycarbonate.

In an embodiment the solar module further comprises a transparent surface bonded by the front encapsulant layer to the frontside of the solar cells.

Typically, the final product, for example the roof, bonnet or trunk of a vehicle, comprises a (transparent) surface comprising (or consisting of) glass or polycarbonate, the surface protecting the encapsulants and the solar cells from the environment. This surface must be a transparent surface so that light can pass to the solar cells, and may be a flat surface (or plate) or a curved surface at least locally curved in one or two directions. The curvature may for example be needed for esthetic or aerodynamic reasons.

In yet another embodiment the middle encapsulant layer shows cut-outs aligned with the cut-outs in the back contact foil, and the back encapsulant layer bonds through the cut-outs in the back contact foil and the cut-outs in the middle encapsulant layer to parts of the backside of the solar cells.

In this embodiment the back encapsulant layer does not bond to the middle encapsulant layer, but to the backside of the solar cells. This provides a reliable bonding.

In yet another embodiment the solar module comprises a multitude of cut-outs, each cut-out corresponding with one solar cell.

In this embodiment each cut-out in the back contact foil corresponds to one solar cell (although each solar cell may have several corresponding cut-outs). As an alternative one or more cut-outs may cover parts of several solar cells, for example two or four cells.

In still another embodiment each solar cell is bonded to the back encapsulant layer via a bonding to the middle encapsulant layer.

The advantage of this embodiment is that the middle encapsulant layer need not show cut-outs, but only the back contact foil. This results in a simpler manufacturing method and thus a cheaper module.

BRIEF DESCRIPTION OF THE DRAWINGS

The invention is now elucidated using figures, in which identical reference signs indicate corresponding features. To that end.

DETAILED DESCRIPTION OF THE INVENTION

Figure 1:
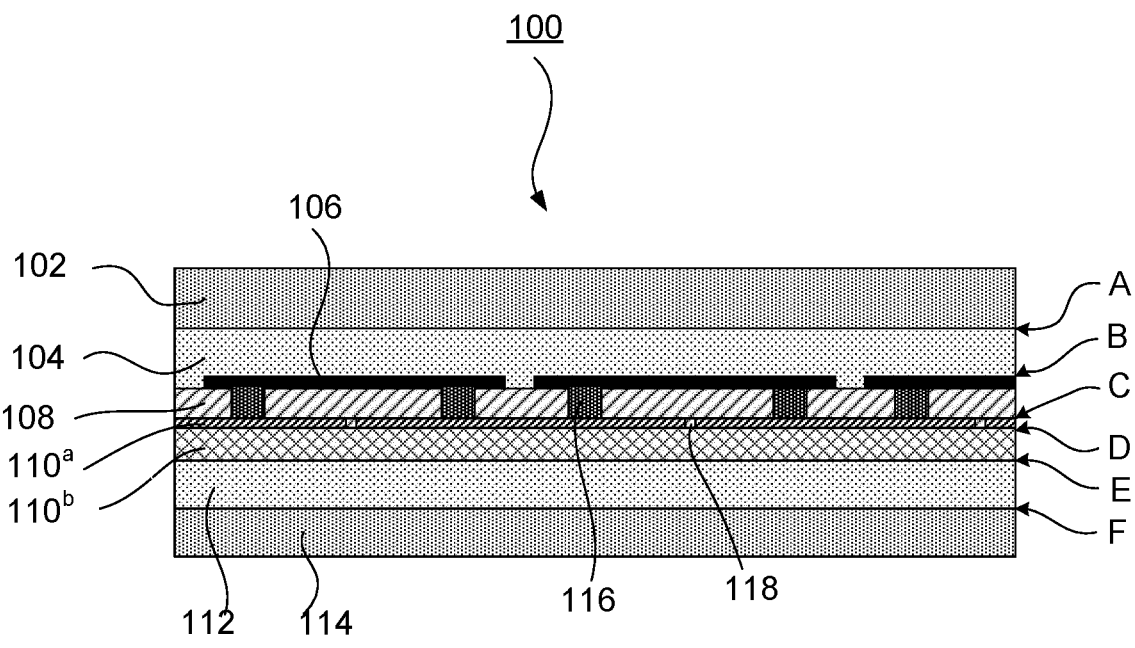
FIG. 1 schematically shows a cross section of a prior art module.

FIG. 1 schematically shows a cross section of a prior art module.

A transparent cover 102, for example a glass or polycarbonate cover. Is bonded (adhered) to a multitude of solar cells 106 using an encapsulant, front encapsulant 104, such as EVA (ethylene vinyl acetate). A back contact foil 110*b* is equipped with a conductive layer 110*a*, preferably a copper layer. The copper layer is patterned, resulting in tracks that are isolated from each other by separations 118.

The back contact foil is for example a layer of EPE, commercially available from e.g. 3M [—1—] or a PET layer. The back contact foil is bonded to the solar cells by middle encapsulant layer 108. Middle encapsulant layer 108 shows cut-outs (holes) aligned with electrodes on the solar cells and contact areas on the back contact foil. Conductive glue 116 fills these holes at least in part, and electrically interconnects the back contact foil and the solar cells. A back encapsulant layer 112 bonds a re-enforcement layer 114, such as a fibre laminate comprising glass or polycarbonate, or a (curved) glass plate.

It is noted that this is a typical stack for a solar module, but that changes in materials and/or stacking may occur.

Literals A, B, C, D, E and F represent the interfaces between the layers of the solar module. When comparing the bonding at these interfaces inventors found that the bonding between interface C and D (so both interfaces involving the copper layer) are much weaker than the other interfaces. This may result in delamination of the module at either side of the copper foil.

To improve the adhesion between encapsulant and back contact foil (provided that the problem is recognized, identified and addressed) it may seem obvious to remove as much copper as possible. Complete removal of the copper is obviously not possible as a low resistance is needed for the current passing between the solar cells. However, even this does not lead to a solution for the bonding, as the bonding between the middle encapsulant and the EPAE or PET layer is still low. A reason for this may be that the EPE or PET layer is still (at least partly) covered with residual adhesive left on the back contact foil after removal of the copper (traces of the adhesive used to bond the copper to the EPE or PET layer of the back contact foil) and that those traces disturbs curing and/or bonding of the middle encapsulant to the EPE or PET layer.

It is noted that for esthetic reasons the middle encapsulant may be a colored layer, preferably in a color identical to or close to the color of the solar cells.

Figure 2:
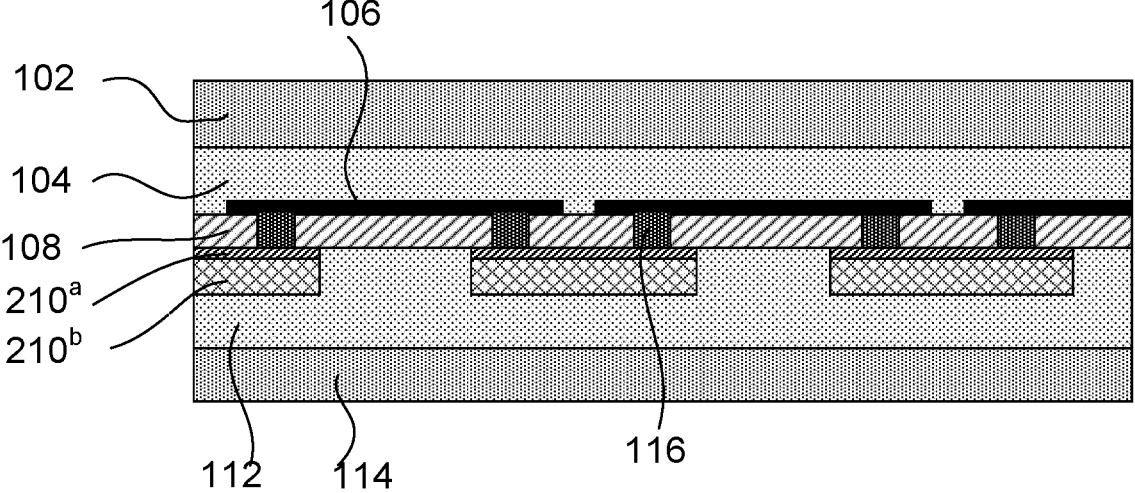
FIG. 2 schematically shows a cross section of a module according to the invention.

FIG. 2 schematically shows a cross section of an embodiment of the invention.

FIG. 2 can be thought to be derived from FIG. 1. However, the back contact foil 210*a*+210*b* differs from the back contact foil 110*a*+110*b* shown in FIG. 1 and now has cut-outs through which the middle encapsulant 108 and the back encapsulant 112 are in contact with each other and are bonded to each other. These two encapsulants show a very strong bonding, and therefore the risk of delamination of the module is to a large degree minimized.

It is noted that here the back encapsulant fills the cut-outs in the back contact foil. As an alternative these can be filled by the middle encapsulant, or partly by one and partly by the other. Essential is that the two encapsulants, the middle encapsulant and the back encapsulant 112, contact each other and bond to each other.

It is noted that a minimum amount of copper is needed to guarantee a low resistance of the copper for the current passing through it. On the other hand, a minimum amount of back contact foil, and thus copper, must be removed to guarantee sufficient bonding between the back encapsulant and the middle encapsulant. The optimization hereof is left to the skilled person.

Figure 3:
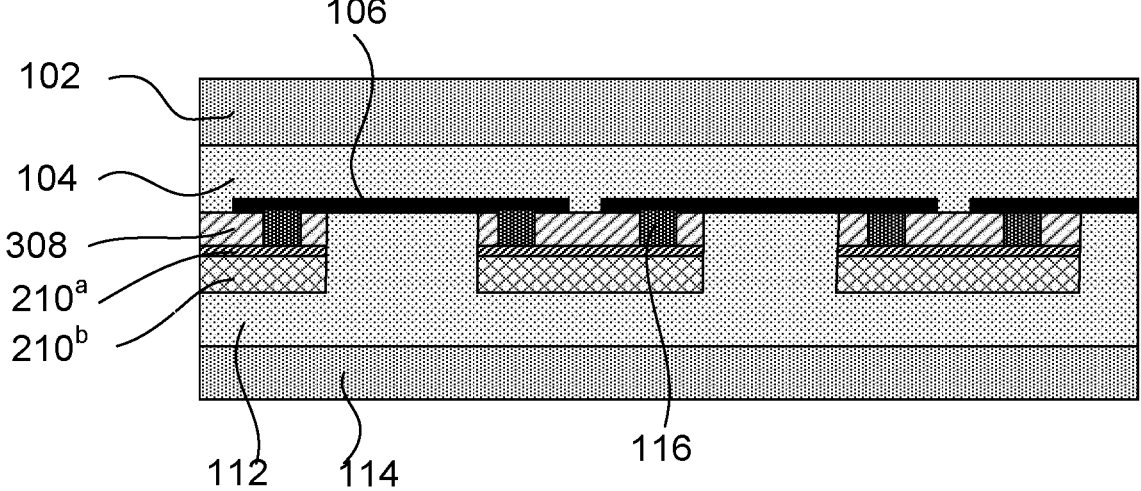
FIG. 3 schematically shows a cross section of an alternative module according to the invention

FIG. 3 schematically shows a cross section of an alternative module according to the invention.

FIG. 3 can be thought to be derived from FIG. 2. Back contact foil 210a+210b has identical holes as the back contact foil shown in FIG. 2. Middle encapsulant layer 308 differs from the middle encapsulant layer 108 shown in FIGS. 1 and 2 in that it shows cut-outs (holes) similar and aligned with the holes in the back contact foil, as a result of which the back encapsulant layer is in contact with the backside of the solar cells and bonded to them.

It is noted that for esthetic reasons the middle encapsulant may be a colored layer, preferably in a color identical to or close to the color of the solar cells. In that case the middle encapsulant must be present in all areas where a small gap between the cells occurs, as otherwise the lack of middle encapsulant at these gaps might be visible and thus disturbs the esthetic properties of the module. Another solution to this problem may be to color the middle and/or back encapsulant.

REFERENCES

[—1—] 3M™ EPE Film D300: https://multimedia.3m.com/mws/media/7525980/3m-epe-films.pdf

The invention claimed is:

1. A solar module, comprising:
a multitude of solar cells, each cell having a photosensitive frontside and having a backside, the backside equipped with electrodes,
a front encapsulant layer bonded to the frontside of the solar cells,
a middle encapsulant layer with cut-outs, the cut-outs aligned with the electrodes of the solar cells such that the front encapsulant layer does not directly contact the cut-outs, the middle encapsulant layer bonded to the backside of the solar cells,
a back contact foil with a patterned metallization layer, the patterned metallization layer facing the solar cells, the patterned metallization layer for contacting the electrodes of the solar cells, the side with the patterned metallization layer bonded to the middle encapsulant layer,
a conductive paste or solder electrically connecting the electrodes to parts of the patterned metallization layer,
a back encapsulant layer bonded to the back contact foil in such a manner that the back contact foil is sandwiched between the middle encapsulant layer and the back encapsulant layer,
wherein the back contact foil comprises cut-outs through which the back encapsulant layer bonds to the middle encapsulant layer and/or to the solar cells,
in which the middle encapsulant layer comprises cut-outs aligned with the cut-outs in the back contact foil, and the back encapsulant layer bonds through the cut-outs in the back contact foil and the cut-outs in the middle encapsulant layer to parts of the backside of the solar cells, such that the back encapsulant layer is in direct contact with the parts of the backside of the solar cells.

2. The solar module of claim 1 further comprising a transparent surface bonded by the front encapsulant to the frontside of the solar cells.

3. The solar module of claim 2 in which the transparent surface is a curved transparent surface, at least locally curved in one or two directions.

4. The solar module of claim 2 in which the transparent surface comprises glass or polycarbonate.

5. The solar module of claim 1 further comprising a re-enforcement layer bonded to the back encapsulant layer.

6. The solar module of claim 5 in which the re-enforcement layer comprises a composite material, a sandwich structure, glass, or polycarbonate.

7. The solar module of claim 5 in which the module comprises a transparent surface bonded to the frontside of the solar cells and the re-enforcement layer comprises the same material as the transparent surface.

8. The solar module of claim 1 in which each cut-out of the back contact foil correspond with one solar cell.

9. The solar module of claim 1 in which each solar cell has at least one corresponding cut-out in the back contact foil.

* * * * *